United States Patent
Seo et al.

(10) Patent No.: US 11,127,912 B2
(45) Date of Patent: Sep. 21, 2021

(54) LIGHT EMITTING DEVICE AND DISPLAY DEVICE INCLUDING THE SAME

(71) Applicant: SAMSUNG ELECTRONICS CO., LTD., Suwon-si (KR)

(72) Inventors: Hongkyu Seo, Anyang-si (KR); Moon Gyu Han, Suwon-si (KR); Eun Joo Jang, Suwon-si (KR); Sujin Park, Seoul (KR); Dae Young Chung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 244 days.

(21) Appl. No.: 16/512,954

(22) Filed: Jul. 16, 2019

(65) Prior Publication Data
US 2020/0028105 A1   Jan. 23, 2020

(30) Foreign Application Priority Data
Jul. 17, 2018 (KR) .................. 10-2018-0083061

(51) Int. Cl.
*H01L 51/50* (2006.01)
*H01L 33/50* (2010.01)
*H01L 51/44* (2006.01)

(52) U.S. Cl.
CPC .......... *H01L 51/502* (2013.01); *H01L 33/502* (2013.01); *H01L 51/442* (2013.01); *H01L 2251/308* (2013.01)

(58) Field of Classification Search
None
See application file for complete search history.

(56) References Cited

U.S. PATENT DOCUMENTS

| | | | |
|---|---|---|---|
| 9,406,910 B2 | 8/2016 | Goto et al. | |
| 9,455,059 B2 | 9/2016 | Blouin et al. | |
| 2016/0268533 A1 | 9/2016 | Lin et al. | |
| 2016/0322568 A1 | 11/2016 | Fadhel et al. | |
| 2017/0222162 A1 | 8/2017 | Lee et al. | |
| 2017/0352827 A1 | 12/2017 | Cho et al. | |
| 2019/0280231 A1* | 9/2019 | Kim ............... | C09K 11/02 |

FOREIGN PATENT DOCUMENTS

| | | |
|---|---|---|
| CN | 106531892 A | 3/2017 |
| EP | 1744598 A1 | 1/2007 |
| JP | 2013501827 A | 1/2013 |
| JP | 2016050195 A | 4/2016 |
| JP | 2017502518 A | 1/2017 |

(Continued)

OTHER PUBLICATIONS

Notice of Allowance dated Jan. 22, 2021 in connection with the corresponding Korean Patent Application No. 10-2019-0086535.

(Continued)

*Primary Examiner* — Gregory D Clark
(74) *Attorney, Agent, or Firm* — Cantor Colburn LLP

(57) ABSTRACT

A light emitting device including a first electrode and a second electrode facing each other, an emission layer disposed between the first electrode and the second electrode, the emission layer including quantum dots, and an electron auxiliary layer disposed between the emission layer and the second electrode, the electron auxiliary layer including nanoparticles and a small molecule organic compound and a display device including the same. The nanoparticles include a metal oxide including zinc, and an electron mobility of the small molecule organic compound is less than an electron mobility of the nanoparticles.

25 Claims, 7 Drawing Sheets

(56) References Cited

FOREIGN PATENT DOCUMENTS

| KR | 20120061000 A | 6/2012 |
|---|---|---|
| KR | 20170087095 A | 7/2017 |
| KR | 1020170090216 A | 8/2017 |
| KR | 1794082 A | 11/2017 |
| KR | 1020180090475 A | 8/2018 |
| WO | 2013012271 A2 | 1/2013 |
| WO | 2013019299 A2 | 2/2013 |
| WO | 2013019299 A3 | 4/2013 |

OTHER PUBLICATIONS

Jiangyong Pan et al., "Size Tunable ZnO Nanoparticles to Enhance Electron Injection in Solution Processed QLEDs," ACS Photonics, Jan. 22, 2016, pp. 215-222, vol. 3.
Jong-Hoon Kim et al., "Performance Improvement of Quantum Dot-Light-Emitting Diodes Enabled by an Alloyed ZnMgO Nanoparticle Electron Transport Layer," Chemistry of Materials, Dec. 9, 2014, pp. 197-204, Vo. 27.
Moon Kee Choi et al., "Flexible quantum dot light-emitting diodes for next-generation displays," npj Flexible Electronics, Apr. 5, 2018, pp. 1-14, Article No. 10(2018).
Peng Wang et al., "A Few Key Technologies of Quantum Dot Light-Emitting Diodes for Display," IEEE Journal of Selected Topics in Quantum Electronics, Sep./Oct. 2017, pp. 1-12, Article Sequence No. 2000312, vol. 23, Issue No. 5.
Sjoerd A. Veldhuis et al., "Crown Ethers Enable Room-Temperature Synthesis of CsPbBr3 Quantum Dots for Light-Emitting Diodes," ACS Energy Lett., Feb. 1, 2018, pp. 526-531, vol. 3.
The extended European Search Report dated Oct. 17, 2019, of the corresponding European Patent Application No. 19186551.8.

* cited by examiner

LIGHT EMITTING DEVICE AND DISPLAY DEVICE INCLUDING THE SAME

CROSS-REFERENCE TO RELATED APPLICATION

This application claims priority to and the benefit of Korean Patent Application No. 10-2018-0083061 filed in the Korean Intellectual Property Office on Jul. 17, 2018, and all the benefits accruing therefrom under 35 U.S.C. § 119, the content of which in its entirety is herein incorporated by reference.

BACKGROUND

1. Field

A light emitting device and a display device are disclosed.

2. Description of the Related Art

Physical characteristics (e.g., energy bandgaps, melting points, etc.) of nanoparticles that are intrinsic characteristics may be controlled by changing the particle sizes of the nanoparticles, unlike bulk materials. For example, semiconductor nanocrystals also known as quantum dots may be supplied with photoenergy or electrical energy and may emit light in a wavelength corresponding to sizes of the quantum dots. Accordingly, the quantum dots may be used as a light emitting element emitting light of a particular wavelength.

SUMMARY

Quantum dots may be used as a light emitting device. However, a new method of improving a performance of a light emitting device including quantum dots is desired.

An embodiment provides a light emitting device capable of realizing improved performance.

An embodiment provides a display device including the light emitting device.

According to an embodiment, a light emitting device includes, a first electrode and a second electrode facing each other, an emission layer disposed between the first electrode and the second electrode, the emission layer including quantum dots, and an electron auxiliary layer disposed between the emission layer and the second electrode, the electron auxiliary layer including nanoparticles and a small molecule organic compound, wherein the nanoparticles include a metal oxide including zinc, and an electron mobility of the small molecule organic compound is less than an electron mobility of the nanoparticles.

The small molecule organic compound may transport an electron.

A work function of the first electrode may be greater than a work function of the second electrode.

The first electrode may include indium tin oxide.

The second electrode may include a conductive metal.

The quantum dots may not include cadmium.

The quantum dots may include indium and phosphorus.

The quantum dots may include a chalcogen element and zinc.

An absolute value of a lowest unoccupied molecular orbital (LUMO) of the quantum dots may be less than an absolute value of a LUMO of the metal oxide.

An absolute value of a LUMO of the quantum dots may be greater than an absolute value of a LUMO of the metal oxide.

The metal oxide may include $Zn_{1-x}M_xO$ (wherein, M is Mg, Ca, Zr, W, Li, Ti, Y, Al, or a combination thereof and $0 \leq x \leq 0.5$).

The metal oxide may include a zinc oxide, a zinc magnesium oxide, or a combination thereof.

An average size of the nanoparticles may be greater than or equal to about 1 nanometers (nm).

The average size of the nanoparticles may be less than or equal to about 10 nm.

The average size of the nanoparticles may be greater than or equal to about 1.5 nm.

The average size of the nanoparticles may be less than or equal to about 5 nm.

The organic small molecule compound may have an absolute value of an LUMO energy level of greater than or equal to about 2.5 electronvolts (eV) and less than or equal to about 3 eV.

Electron mobility in a thin film including the small molecule organic compound may be lower than electron mobility in a thin film including the nanoparticles.

The small molecule organic compound may include a compound including a triaryl phosphine oxide moiety linked with an aromatic ring.

The small molecule organic compound may include a compound represented by Chemical Formula 2:

Chemical Formula 1

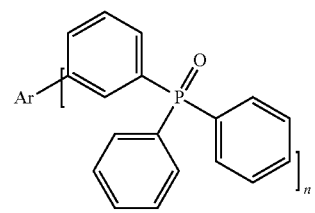

wherein, Ar is a substituted or unsubstituted C6 to C40 aryl group, a substituted or unsubstituted C3 to C40 heteroaryl group, a substituted or unsubstituted C3 to C40 heterocycloalkyl group, or a combination thereof and n is an integer of 1 to 10, for example, greater than or equal to 1, greater than or equal to 2, or greater than or equal to 3 and less than or equal to 10, less than or equal to 9, less than or equal to 8, less than or equal to 7, less than or equal to 6, or less than or equal to 5.

The small molecule organic compound may include a compound represented by Chemical Formula 2-1:

Chemical Formula 2-1

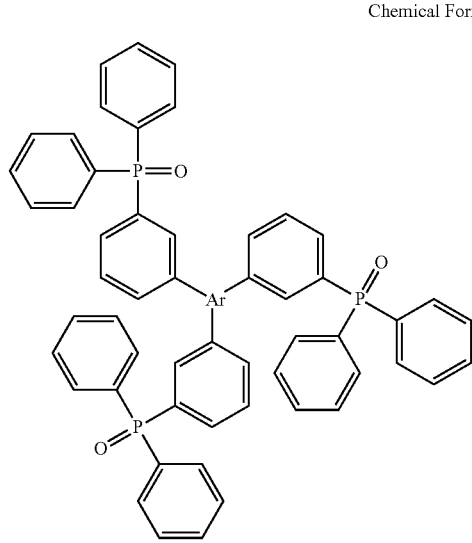

wherein, Ar is a substituted or unsubstituted C6 to C40 aryl group, a substituted or unsubstituted C3 to C40 heteroaryl group, a substituted or unsubstituted C3 to C40 heterocycloalkyl group, or a combination thereof.

In the electron auxiliary layer, a content of carbon relative to 1 mole of zinc may be greater than or equal to about 0.01 moles, for example, greater than or equal to about 0.05 moles, or greater than or equal to about 0.1 moles.

In the electron auxiliary layer, the content of carbon relative to 1 mole of zinc may be less than or equal to about 20 moles, for example, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 11 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles, less than or equal to about 1 mole, less than or equal to about 0.9 moles, or less than or equal to about 0.8 moles.

The quantum dots may emit light having a center wavelength of about 600 nm to about 640 nm and a thickness of the electron auxiliary layer may be greater than or equal to about 20 nm and less than or equal to about 70 nm.

The quantum dots may emit light having a center wavelength of less than or equal to about 500 nm and the thickness of the electron auxiliary layer may be greater than or equal to about 60 nm and less than or equal to about 100 nm.

In an embodiment, a method of manufacturing the aforementioned light emitting device includes dispersing the nanoparticles and the organic small molecule compound in a polar organic solvent to prepare dispersion;

applying the dispersion on the emission layer including the quantum dots to form the electron auxiliary layer; and removing the polar organic solvent from the electron auxiliary layer.

The polar organic solvent may include an alcohol solvent, a sulfoxide solvent, an amide solvent, and the like.

In the dispersion, a content of the small molecule organic compound based on 100 parts by weight of the nanoparticles may be greater than or equal to about 1 part by weight, for example, greater than or equal to about 5 parts by weight, greater than or equal to about 10 parts by weight, greater than or equal to about 15 parts by weight, or greater than or equal to about 20 parts by weight.

In the dispersion, a content of the small molecule organic compound relative to 100 parts by weight of the nanoparticles may be less than or equal to about 50 parts by weight, for example, less than or equal to about 45 parts by weight, less than or equal to about 40 parts by weight, less than or equal to about 35 parts by weight, less than or equal to about 30 parts by weight, less than or equal to about 25 parts by weight, or less than or equal to about 20 parts by weight.

In an embodiment, a method of manufacturing a light emitting device is provided, the method includes:

dispersing ZnO nanoparticles and a small molecule organic compound in a polar organic solvent to prepare a dispersion, wherein the small molecule organic compound comprises a compound represented by Chemical Formula 2:

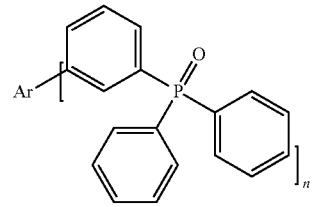

Chemical Formula 2 wherein, Ar is a substituted or unsubstituted C6 to C40 aryl group, a substituted or unsubstituted C3 to C40 heteroaryl group, a substituted or unsubstituted C3 to C40 heterocycloalkyl group, or a combination thereof, and n is an integer of 1 to 10; and applying the dispersion on an emission layer comprising quantum dots to form an electron auxiliary layer, wherein the quantum dots comprise indium and phosphorous or a chalcogen element and zinc, and do not comprise cadmium An embodiment provides a display device including the aforementioned light emitting device.

According to an embodiment, a high level of leakage current of a Zn metal oxide-including device may be effectively reduced, a balance between the charges injected into the emission layer may be improved, and thus efficiency and life-span of the quantum dot (QD)-based electroluminescent device may be simultaneously improved.

DETAILED DESCRIPTION

Figure 1:
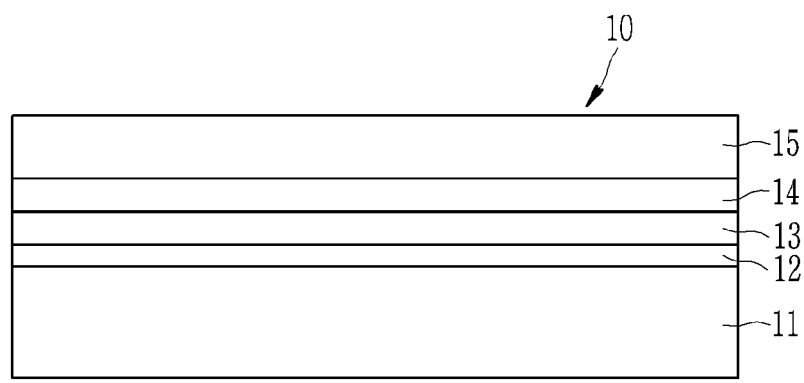
FIG. 1 is a schematic cross-sectional view of a light emitting device according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function or a highest occupied molecular orbital (HOMO) energy level is expressed as an absolute value from a vacuum level. In addition, when the work function or the HOMO energy level is referred to be "deep," "high" or "large," the work function or the HOMO energy level has a large absolute value based on "0 eV" of the vacuum level, while when the work function or the HOMO energy level is referred to be "shallow," "low," or "small," the work function or HOMO energy level has a small absolute value based on "0 eV" of the vacuum level.

A LUMO, a HOMO, and/or a work-function may be measured by using an appropriate method, which is not particularly limited. In an embodiment, a LUMO, a HOMO, and/or a work-function of a given material may be measured by a Cyclic Volumetry (CV) method, a spectroscopic analysis (e.g., an Ultraviolet Photoelectron Spectroscopy (UPS) method and/or an UV-Vis spectroscopy), a Photoelectron spectroscopy in air (e.g., using AC-3), a Kelvin Probe force microscopy measurement, or a combination thereof.

As used herein, the term "Group" may refer to a group of Periodic Table.

As used herein, "Group I" may refer to Group IA and Group IB, and examples may include Li, Na, K, Rb, and Cs, but are not limited thereto.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

As used herein, when a definition is not otherwise provided, "substituted" refers to replacement of hydrogen of a compound, a group, or a moiety by a C1 to C30 alkyl group, a C2 to C30 alkenyl group, a C2 to C30 alkynyl group, a C2 to C30 epoxy group, a C2 to C30 alkyl ester group, a C3 to C30 alkenyl ester group (e.g., an acrylate group, methacrylate group), a C6 to C30 aryl group, a C7 to C30 alkylaryl group, a C1 to C30 alkoxy group, a C1 to C30 heteroalkyl group, C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—O(=O)OR, wherein R is a C1 to C6 alkyl group or a C6 to C12 aryl group), a carboxyl group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, "aliphatic" refers to a C1 to C40 linear or branched hydrocarbon (e.g., alkyl, alkenyl, or alkynyl) group.

As used herein, when a definition is not otherwise provided, "alkoxy" refers to an alkyl group that is linked via an oxygen (i.e., alkyl-O—), for example methoxy, ethoxy, and sec-butyloxy groups.

As used herein, when a definition is not otherwise provided, "alkyl" refers to a straight or branched chain, saturated, monovalent (e.g., C1 to C40) hydrocarbon group (e.g., methyl or hexyl).

As used herein, when a definition is not otherwise provided, "alkylene" refers to a straight or branched saturated (e.g., C2 to C40) aliphatic hydrocarbon group having at least two valences and optionally substituted with at least one substituent.

As used herein, when a definition is not otherwise provided, "alkynyl" refers to a straight or branched chain, monovalent (e.g., C2 to C40) hydrocarbon group having at least one carbon-carbon triple bond (e.g., ethynyl).

As used herein, when a definition is not otherwise provided, an "amine" group has the general formula —NRR, wherein each R is independently hydrogen, a C1-C12 alkyl group, a C7-C20 alkylaryl group, a C7-C20 arylalkyl group, or a C6-C18 aryl group.

As used herein, when a definition is not otherwise provided, "arene" refers to a hydrocarbon having an aromatic ring, and includes monocyclic and polycyclic hydrocarbons wherein the additional ring(s) of the polycyclic hydrocarbon may be aromatic or nonaromatic. Specific arenes may include benzene, naphthalene, toluene, and/or xylene.

As used herein, when a definition is not otherwise provided, "aromatic" refers to an organic compound or group comprising at least one unsaturated cyclic group having delocalized pi electrons. The term encompasses both hydrocarbon aromatic compounds and heteroaromatic compounds.

As used herein, when a definition is not otherwise provided, "aryl" refers to a hydrocarbon group having a valence of at least one, for example, formed by the removal of at least one hydrogen atom from one or more rings of an arene (e.g., phenyl or naphthyl).

As used herein, when a definition is not otherwise provided, "arylalkyl" refers to a substituted or unsubstituted aryl group covalently linked to an alkyl group that is linked to a compound (e.g., a benzyl is a C7 arylalkyl group).

As used herein, when a definition is not otherwise provided, "arylene" refers to a functional group having at least two valences obtained by removal of at least two hydrogens in at least one aromatic ring, and optionally substituted with at least one substituent.

As used herein, when a definition is not otherwise provided, "cycloalkenyl" refers to a monovalent hydrocarbon group having one or more rings and one or more carbon-carbon double bond in the ring, wherein all ring members are carbon (e.g., cyclopentenyl and cyclohexenyl).

As used herein, when a definition is not otherwise provided, "cycloalkyl" refers to a hydrocarbon group having one or more saturated rings and having a valence of at least one in which all ring members are carbon (e.g., cyclopentyl and cyclohexyl).

As used herein, when a definition is not otherwise provided, "cycloalkynyl" refers to a stable aliphatic monocyclic or polycyclic group having at least one carbon-carbon triple bond, wherein all ring members are carbon (e.g., cyclohexynyl).

As used herein, when a definition is not otherwise provided, "ester" refers to a group of the formula —O(C=O)Rx or a group of the formula —(C=O)ORx wherein Rx is C1 to C28 aromatic organic group or aliphatic organic group. An ester group includes a C2 to C30 ester group, and specifically a C2 to C18 ester group.

As used herein, when a definition is not otherwise provided, the term "hetero" refers to inclusion of at least one to three heteroatoms, where the heteroatom(s) may be N, O, S, Si, or P, preferably N, O, or S.

As used herein, when a definition is not otherwise provided, "heteroalkyl" refers to an alkyl group that comprises at least one heteroatom covalently bonded to one or more carbon atoms of the alkyl group.

As used herein, when a definition is not otherwise provided, "heteroaryl" refers to an aromatic group (or an aryl group) that comprises at least one heteroatom covalently bonded to one or more carbon atoms of aromatic ring.

Hereinafter, a light emitting device according to an embodiment is described with reference to drawings.

FIG. 1 is a schematic cross-sectional view of a light emitting device according to an embodiment.

Referring to FIG. 1, a light emitting device 10 according to an embodiment includes a first electrode 11 and a second electrode 15 facing each other, an emission layer 13 disposed between the first electrode 11 and the second electrode 15 and including quantum dots, a hole auxiliary layer 12 disposed between the first electrode 11 and the emission layer 13, and an electron auxiliary layer 14 disposed between the second electrode 15 and the emission layer 13.

A substrate may be disposed on a major surface of the first electrode 11 or on a major surface of the second electrode 15. In an embodiment, the substrate may be disposed on a major surface of the first electrode. The substrate may be a substrate including an insulation material (e.g., insulating transparent substrate). The substrate may include glass; various polymers such as polyesters (e.g., polyethylene terephthalate (PET), polyethylene naphthalate (PEN)), polycarbonate, polyacrylate, polyimide, and polyamideimide; polysiloxane (e.g., PDMS); inorganic materials such as Al$_2$O$_3$ and ZnO; or a combination thereof, but is not limited thereto. The substrate may be made of a silicon wafer. Herein "transparent" may refer to transmittance for light of a predetermined wavelength (e.g., light emitted from the quantum dots) of greater than or equal to about 85%, for example, greater than or equal to about 88%, greater than or equal to about 90%, greater than or equal to about 95%, greater than or equal to about 97%, or greater than or equal to about 99%. A thickness of the substrate may be appropriately selected considering a substrate material but is not particularly limited. The transparent substrate may have flexibility. The substrate may be omitted.

One of the first electrode 11 and the second electrode 15 may be an anode and the other may be a cathode. For example, the first electrode 11 may be an anode and the second electrode 15 may be a cathode.

The first electrode 11 may be made of a conductor, for example a metal, a conductive metal oxide, or a combination thereof. The first electrode 11 may be for example made of a metal or an alloy thereof such as nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide; or a combination of a metal and a metal oxide such as ZnO and Al or SnO$_2$ and Sb, but is not limited thereto. In an embodiment, the first electrode may include a transparent conductive metal oxide, for example, indium tin oxide. A work function of the first electrode may be higher than a work function of the second electrode that will be described later.

The second electrode 15 may be made of a conductor, for example a metal, a conductive metal oxide, a conductive polymer, or a combination thereof. The second electrode 15 may be for example a metal or an alloy thereof such as aluminum, magnesium, calcium, sodium, potassium, titanium, indium, yttrium, lithium, gadolinium, silver, tin, lead, cesium, or barium; a multi-layer structured material such as LiF/Al, Li$_2$O/Al, Liq/Al, LiF/Ca, and BaF$_2$/Ca, but is not limited thereto. The conductive metal oxide is the same as described above.

In an embodiment, a work function of the first electrode 11 may be greater than or equal to about 4.0 eV, greater than or equal to about 4.1 eV, greater than or equal to about 4.2 eV, greater than or equal to about 4.3 eV, greater than or equal to about 4.4 eV, or greater than or equal to about 4.5 eV and less than or equal to about 5.0 eV, for example, less than or equal to about 4.9 eV and the work function of the second electrode 15 may be for example greater than or equal to about 4.0 eV and less than about 4.5 eV. Within the ranges, the work function of the first electrode 11 may be for example about 4.6 eV to about 4.9 eV and the work function of the second electrode 15 may be for example about 4.0 eV to about 4.3 eV.

At least one of the first electrode 11 and the second electrode 15 may be a light-transmitting electrode and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, the non-light-transmitting electrode may be made of for example an opaque conductor such as aluminum (Al), silver (Ag), or gold (Au).

A thickness of the electrodes (the first electrode, the second electrode, or a combination thereof) is not particularly limited and may be appropriately selected considering device efficiency. For example, the thickness of the electrodes may be greater than or equal to about 5 nm, for example, greater than or equal to about 50 nm. For example, the thickness of the electrodes may be less than or equal to about 100 micrometers (μm), for example, 10 μm, less than or equal to about 1 μm, less than or equal to about 900 nm, less than or equal to about 500 nm, or less than or equal to about 100 nm.

The emission layer 13 includes (e.g., a plurality of) quantum dots. The quantum dots (hereinafter, also referred to as semiconductor nanocrystals) may include a Group II-VI compound, a Group III-V compound, a Group IV-VI compound, a Group IV element or compound, a Group I compound, a Group compound, a Group I—II-IV-VI compound, or a combination thereof.

The Group II-VI compound may be a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound such as ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof. The Group II-VI compound may further include a Group III metal. The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, or a combination thereof; or a combination thereof. The Group III-V compound may further include a Group II metal (e.g., InZnP). The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof. Examples of the Group compound may include CuInSe$_2$, CuInS$_2$, CuInGaSe, and CuInGaS, but are not limited thereto. Examples of the Group I-II-IV-VI compound may include CuZnSnSe and CuZnSnS, but are not limited thereto. The Group IV element or compound may be a single substance such as Si, Ge, or a combination thereof; a binary element compound such as SiC, SiGe, or a combination thereof; or a combination thereof.

In an embodiment, the quantum dots may not include cadmium. The quantum dots may include a Group III-V compound-based semiconductor nanocrystal including indium and phosphorus. The Group III-V compound may further include zinc. The quantum dots may include a Group II-VI compound-based semiconductor nanocrystal including a chalcogen element (e.g., sulfur, selenium, tellurium, or a combination thereof) and zinc.

In the quantum dots, the aforementioned binary element compound, ternary element compound, the quaternary element compound, or a combination thereof respectively exist in a uniform concentration in the semiconductor nanocrystal particles or partially different concentrations in the same particles. The semiconductor nanocrystals may have a core/shell structure wherein a first semiconductor nanocrystal (core) is surrounded by another second semiconductor nanocrystal (shell) having a composition that is the same as or different from that of the core. In an embodiment, the quantum dots may include a core including InP, InZnP, ZnSe, ZnSeTe, or a combination thereof and a shell (or a multi-layered shell) having a different composition from the core and including InP, InZnP, ZnSe, ZnS, ZnSeTe, ZnSeS, or a combination thereof.

The core and the shell may have an interface, and an element of at least one of the core or the shell in the interface may have a concentration gradient wherein the concentration of the element(s) of the shell decreases toward the core. The semiconductor nanocrystals may have a structure including one semiconductor nanocrystal core and a multi-layered shell surrounding the same. Herein, the multi-layered shell has at least two shells wherein each shell may be a single composition, may be an alloy, may have a concentration gradient, or a combination thereof.

In the quantum dots, the shell material and the core material may have different energy bandgap from each other. For example, the energy bandgap of the shell material may be greater than that of the core material. According to an embodiment, the energy bandgap of the shell material may be less than that of the core material. The quantum dots may have a multi-layered shell. In the multi-layered shell, the energy bandgap of the outer layer may be greater than the energy bandgap of the inner layer (i.e., the layer nearer to the core. In the multi-layered shell, the energy bandgap of the outer layer may be less than the energy bandgap of the inner layer.

The quantum dots may control an absorption/photoluminescence wavelength by adjusting a composition and a size. A maximum photoluminescence peak wavelength of the quantum dots may be an ultraviolet (UV) to infrared wavelength or a wavelength of greater than the above wavelength range. For example, the maximum photoluminescence peak wavelength of the quantum dots may be greater than or equal to about 300 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum photoluminescence wavelength of the quantum dots may be less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum photoluminescence wavelength of the quantum dots may be in the range of about 500 nm to about 650 nm. The maximum photoluminescence wavelength of the quantum dots may be in the range of about 500 nm to about 540 nm. The maximum photoluminescence wavelength of the quantum dots may be in the range of about 610 nm to about 640 nm.

The quantum dots may have quantum efficiency of greater than or equal to about 10%, for example greater than or equal to about 30%, greater than or equal to about 50%, greater than or equal to about 60%, greater than or equal to about 70%, greater than or equal to about 90%, or even about 100%. The quantum dots may have a relatively narrow spectrum. The quantum dots may have for example a full width at half maximum (FWHM) of a photoluminescence wavelength spectrum of less than or equal to about 50 nm, for example less than or equal to about 45 nm, less than or equal to about 40 nm, or less than or equal to about 30 nm.

The quantum dots may have a (average) particle size (e.g., a diameter or the largest linear length crossing the particle) of greater than or equal to about 1 nm and less than or equal to about 100 nm. The quantum dots may have a (average) particle size of about 1 nm to about 50 nm, for example, greater than or equal to about 2 nm, greater than or equal to about 3 nm, or greater than or equal to about 4 nm and less than or equal to about 50 nm, less than or equal to about 40 nm, less than or equal to about 30 nm, less than or equal to about 20 nm, less than or equal to about 15 nm, or less than or equal to about 10 nm. The shapes of the quantum dots are not particularly limited. For example, the shape of the quantum dots may be a sphere, a polyhedron, a pyramid, a multipod, a square, a rectangular parallelepiped, a nanotube, a nanorod, a nanowire, a nanosheet, or a combination thereof, but is not limited thereto.

In an embodiment, a particle size (e.g., for quantum dots or for a metal oxide particle) may be measured by using an electron microscopy analysis (e.g., TEM). In an embodiment, a particle size may be measured (e.g., calculated by using a commercial image analysis program such as Image J) from a two dimensional image obtained from the electron microscope. In an embodiment, a particle size (e.g., for quantum dots or for a metal oxide particle) may be an average (e.g., a mean, mode, or median average) size. An average may be a mean, mode, or median average.

The quantum dots may be commercially available or may be appropriately synthesized. When quantum dots are colloid-synthesized, the particle size may be relatively freely controlled and also uniformly controlled.

The quantum dots may include an organic ligand (e.g., having a hydrophobic moiety). The organic ligand moiety may be bound to surfaces of the quantum dots. The organic ligand may include RCOOH, $RNH_2$, $R_2NH$, $R_3N$, RSH, $R_3PO$, $R_3P$, ROH, RCOOR, $RPO(OH)_2$, RHPOOH, RHPOOH, or a combination thereof, wherein, each R is independently a C3 (e.g., C5) to C24 substituted or unsubstituted aliphatic hydrocarbon group such as C3 to C24 alkyl or alkenyl, a C6 to C20 substituted or unsubstituted aromatic hydrocarbon group such as a C6 to C20 aryl group, or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine compound such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributyl amine, or trioctyl amine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octyl phosphine, dioctyl phosphine, tributyl phosphine, diphenyl phosphine, triphenyl phosphine, or trioctyl phosphine; a phosphine oxide compound such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, diphenyl phosphine oxide, triphenyl phosphine oxide, or trioctyl phosphine oxide; a C5 to C20 alkyl phosphonic acid; a C5 to C20 alkyl phosphinic acid such as hexyl phosphinic acid, octyl phosphinic acid, dodecane phosphinic acid, tetradecane phosphinic acid, hexadecane phosphinic acid, octadecane phosphinic acid; and the like, but are not limited thereto. The quantum dots may include a hydrophobic organic ligand alone or in a mixture of at least one type. The hydrophobic organic ligand may not include a photopolymerizable moiety (e.g., acrylate group, methacrylate group, etc.).

In an embodiment, the emission layer 13 may include a monolayer of quantum dots. In an embodiment, the emission layer 13 may include at least one monolayer of quantum dots, for example, 2 or more monolayers, 3 or more layers, or 4 or more monolayers, and 20 or less monolayers, and 10 or less monolayers, 9 or less monolayers, 8 or less monolayers, 7 or less monolayers, or 6 or less monolayers. The emission layer 13 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The emission layer 13 may have for example a thickness of about 10 nm to about 150 nm, for example about 10 nm to about 100 nm, for example about 10 nm to about 50 nm.

The emission layer 13 may have a HOMO energy level of greater than or equal to about 5.4 eV, greater than or equal to about 5.6 eV, greater than or equal to about 5.7 eV, greater than or equal to about 5.8 eV, greater than or equal to about 5.9 eV, or greater than or equal to about 6.0 eV. The emission layer 13 may have a HOMO energy level of than or equal to about 7.0 eV, less than or equal to about 6.8 eV, less than or equal to about 6.7 eV, less than or equal to about 6.5 eV, less than or equal to about 6.3 eV, or less than or equal to about 6.2 eV. In an embodiment, the emission layer 13 may have a HOMO energy level of about 5.6 eV to about 6.0 eV.

The emission layer 13 may have for example an LUMO energy level of less than or equal to about 3.8 eV, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The emission layer 13 may have an LUMO energy level of greater than or equal to about 2.5 eV. In an embodiment, the emission layer 13 may have an energy bandgap of about 2.4 eV to about 2.9 eV.

The hole auxiliary layer 12 is disposed between the first electrode 11 and the emission layer 13. The hole auxiliary layer 12 may have one layer or two or more layers, and may include for example a hole injection layer (HIL), a hole transport layer (HTL), an electron blocking layer, or a combination thereof.

The hole auxiliary layer 12 may have a HOMO energy level that may match a HOMO energy level of the emission layer 13 and may enforce, e.g., aid, mobility of holes from the hole auxiliary layer 12 into the emission layer 13.

The HOMO energy level of the hole auxiliary layer 12 (e.g., hole transport layer (HTL)) contacting the emission layer may be the same as or less than the HOMO energy level of the emission layer 13 within a range of less than or equal to about 1.0 eV. For example, a difference of HOMO energy levels between the hole auxiliary layer 12 and the emission layer 13 may be about 0 eV to about 1.0 eV, for example about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The HOMO energy level of the hole auxiliary layer 12 may be for example greater than or equal to about 5.0 eV, for example, greater than or equal to about 5.2 eV, greater than or equal to about 5.4 eV, greater than or equal to about 5.6 eV, or greater than or equal to about 5.8 eV.

For example, the HOMO energy level of the hole auxiliary layer 12 may be about 5.0 eV to about 7.0 eV, about 5.2 eV to 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

In an embodiment, the hole auxiliary layer 12 may include a hole injection layer near to the first electrode 11 and a hole transport layer near to the emission layer 13. Herein, the HOMO energy level of the hole injection layer may be about 5.0 eV to about 6.0 eV, for example about 5.0 eV to about 5.5 eV, or about 5.0 eV to about 5.4 eV and the HOMO energy level of the hole transport layer may be about 5.2 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV.

A material included in the hole auxiliary layer 12 is not particularly limited and may include for example at least one of poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4-bis[N-(1-naphthyl)-N-phenylamino]biphenyl (α-NPD), m-MTDATA (4,4',4"-tris[phenyl (m-tolyl)amino]triphenylamine), 4,4',4"-tris(N-carbazolyl)-triphenylamine (TCTA), 1,1-bis[(di-4-tolylamino) phenylcyclohexane (TAPC), p-type metal oxide (e.g., NiO, $WO_3$, $MoO_3$, etc.), a carbon-based material such as graphene oxide, and a combination thereof, but is not limited thereto.

In the hole auxiliary layer(s), a thickness of each layer may be appropriately selected. For example, the thickness of each layer may be greater than or equal to about 10 nm, for example, greater than or equal to about 15 nm, greater than or equal to about 20 nm and less than or equal to about 100 nm, for example, less than or equal to about 90 nm, less than or equal to about 80 nm, less than or equal to about 70 nm, less than or equal to about 60 nm, or less than or equal to about 50 nm, but is not limited thereto.

The electron auxiliary layer 14 is disposed between the emission layer 13 and the second electrode 15. The electron auxiliary layer 14 may include for example an electron injection layer, an electron transport layer, a hole blocking layer, or a combination thereof, but is not limited thereto.

The electron auxiliary layer 14 may be an electron transport layer. The electron auxiliary layer 14 includes nanoparticles and a small molecule organic compound. The nanoparticles include metal oxides including zinc. The small molecule organic compound includes carbon. The small molecule organic compound may include a compound capable of transporting electrons. An electron mobility of the small molecule organic compound is less than an electron mobility of the nanoparticles.

The metal oxide may include a metal oxide of Chemical Formula 1

$Zn_{1-x}M_xO$ wherein, in Chemical Formula 1, M is Mg, Ca, Zr, W, Li, Ti, Y, Al, or a combination thereof and $0 \leq x \leq 0.5$. The x may be greater than 0. The x may be less than 0.5, less than or equal to about 0.45, less than or equal to about 0.35, less than or equal to about 0.25, or less than or equal to about 0.15. In an embodiment, in Chemical Formula 1, M may be magnesium (Mg). In an embodiment, in Chemical Formula 1, x may be greater than or equal to about 0.01 and less than or equal to about 0.3, for example, less than or equal to about 0.15.

The metal oxide may include zinc oxide, zinc magnesium oxide, or a combination thereof.

An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticles may not have a rod shape, or a nanowire shape.

An absolute value of a lowest unoccupied molecular orbital (LUMO) of the quantum dots may be less than an absolute value of a LUMO of the metal oxide. An absolute value of a lowest unoccupied molecular orbital (LUMO) of the quantum dots may be greater than an absolute value of a LUMO of the metal oxide.

An absolute value of the LUMO of the metal oxide may be greater than or equal to about 2 eV, greater than or equal to about 2.5 eV, greater than or equal to about 3 eV, greater than or equal to about 3.5 eV, or greater than or equal to about 4 eV and less than or equal to about 5 eV, less than or equal to about 4.5 eV, less than or equal to about 4 eV, less than or equal to about 3.5 eV, or less than or equal to about 3 eV.

An absolute value of the HOMO of the metal oxide may be greater than or equal to about 5 eV, greater than or equal to about 5.5 eV, greater than or equal to about 6 eV, greater than or equal to about 6.5 eV, or greater than or equal to about 7 eV and less than or equal to about 8 eV, less than or equal to about 7.5 eV, less than or equal to about 7 eV, less than or equal to about 6.5 eV, or less than or equal to about 6 eV.

An energy bandgap of the metal oxide may be greater than or equal to about 2 eV, greater than or equal to about 2.5 eV, greater than or equal to about 3 eV, greater than or equal to about 3.5 eV, or greater than or equal to about 4 eV and less than or equal to about 5 eV, less than or equal to about 4.5 eV, less than or equal to about 4 eV, less than or equal to about 3.5 eV, or less than or equal to about 3 eV.

Figure 7:
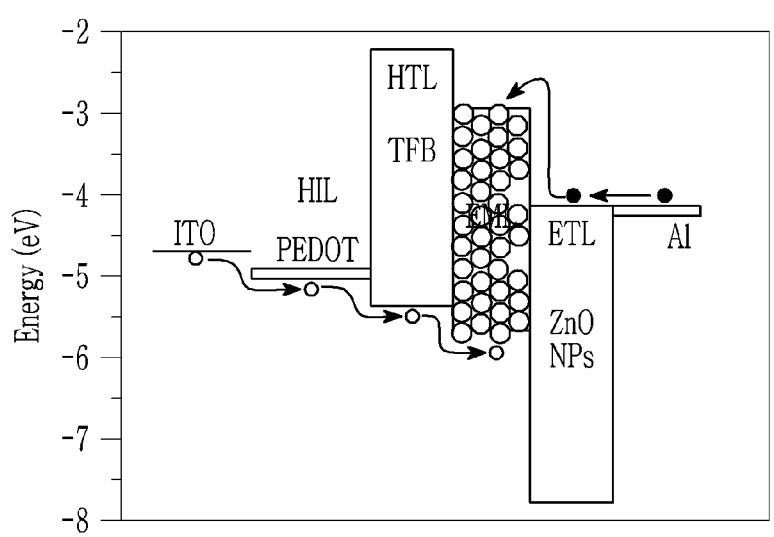
FIG. 7 is an energy band diagram of a device according to an embodiment, wherein an energy level alignment for each of the layers may represent an energy level relationship of a given device.
Figure 8:
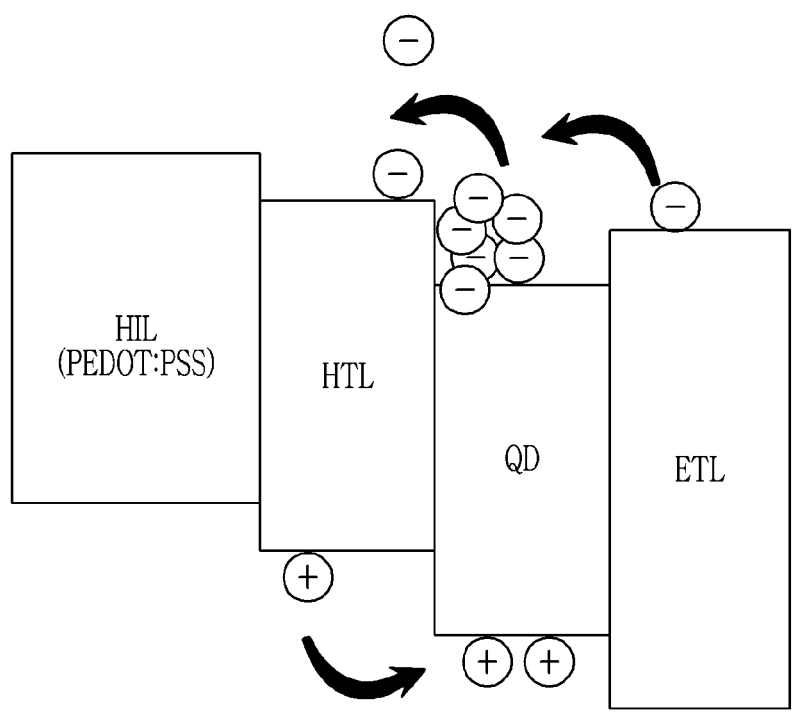
FIG. 8 is an energy band diagram of a device according to another embodiment, wherein an energy level alignment for each of the layers may represent an energy level relationship of a given device.

In a (electroluminescent) QD-light emitting device, holes and electrons injected from an anode and a cathode, respectively, are each passed through common layers (e.g., electron auxiliary layer such as an EIL and an ETL and hole auxiliary layer such as an HIL and an HTL) and met in the emission layer including quantum dots to form exciton and then are recombined to emit light. (see FIG. 7 and FIG. 8)

The common layer between the emission layer and the electrode (anode and cathode) may be desired to ensure, e.g., aid, the smooth transport of holes and electrons when applying a voltage. An enhanced electron mobility of an electron auxiliary layer, for example, an electron transport layer may ensure, e.g., aid, a hole-electron balance in the emission layer, which may be desired for effectively transporting electrons from the electrode to the quantum dot emission layer. In addition, hole transporting from the quantum dot emission layer may be blocked by the energy level (e.g., HOMO) of the electron auxiliary layer.

The present inventors have found that when the quantum dot light emitting device includes an electron transport layer based on the metal oxide including Zn, electrons are more dominant than holes for transporting charge from the cathode to the QD-LED emission layer. Without being bound by any theory, it is believed that a Zn metal oxide-based electron transport layer may exhibit an enhanced electron transport capability (e.g., high electron injection properties and electron mobility) while the quantum dot-based electroluminescent device exhibits a slow hole transport property.

Excess electrons with respect to the injected holes may flow in the light emitting device, the hole-electron balance may not be guaranteed, e.g., achieved, and the light emitting efficiency of the device may deteriorate. Electrons may be accumulated on an interface between the hole transport layer (HTL) and the quantum dot emission layer. The excess electrons may cause interface degradation and may be lost during passing the interface, which may cause an increase in the number of non-light emitting charges and lead to deterioration of life-span and performance of a QD-LED. Accordingly, the electron auxiliary layer based on nanoparticles including a Zn metal oxide may exhibit a high level of leakage current, it may be difficult to secure, e.g., achieve, a hole-electron balance, and it may be difficult to realize an efficiency enhancement and a life-span extension in the quantum dot-based device.

As some of organic material-based electron transport layers may exhibit a low LUMO energy level and low electron mobility, smooth electron injection may be difficult to achieve, and charges may be accumulated in the device, which may cause a decrease in the life-span of the device.

The light emitting device according to an embodiment has an electron auxiliary layer including a mixture of the metal oxide-containing nanoparticles and the small molecule organic compound (e.g., having an electron transport capability, and also having a lower electron mobility than the electron mobility of the aforementioned metal oxide-containing nanoparticle). The mixed electron auxiliary layer may induce an effective exciton bond of hole-electron to improve the efficiency and to minimize the interface accumulation and loss of electrons, thus the life-span of the light emitting device may be improved.

According to an embodiment, the small molecule organic compound is a material having a lower mobility than the metal oxide including zinc but being capable of transporting charge (electron or hole).

A carrier (e.g., hole or electron) mobility may provide an indication as to how fast the carrier may move in a given electric filed. In embodiment, the carrier mobility (e.g., the electron mobility) of a given material may be measured in an appropriate known method. In an embodiment, the carrier mobility (e.g., the electron mobility) may be measured by a time of flight (TOF) method, a field-effect mobility (FEM) method, an Impedance Spectroscopy, a Space Charge Limited Current (SCLC) measurement or a combination thereof.

An electron mobility (unit: $cm^2\ V^{-1}\ s^{-1}$) of the small molecule organic compound may be greater than or equal to about $1 \times 10^{-4}$, greater than or equal to about $2.5 \times 10^{-4}$, greater than or equal to about $4 \times 10^{-4}$, greater than or equal to about $8 \times 10^{-4}$, greater than or equal to about $1 \times 10^{-3}$, greater than or equal to about $2.5 \times 10^{-3}$, greater than or equal to about $4 \times 10^{-3}$, greater than or equal to about $8 \times 10^{-3}$, or greater than or equal to about $9 \times 10^{-3}$.

The electron mobility (unit: $cm^2\ V^{-1}\ s^{-1}$) of the small molecule organic compound may be less than or equal to about 0.1, less than or equal to about 0.05, less than or equal to about 0.01, less than or equal to about 0.005, less than or equal to about 0.001, or less than or equal to about 0.0005.

An electron mobility (unit: $cm^2\ V^{-1}\ s^{-1}$) of the metal oxide may be greater than or equal to about $1 \times 10^{-3}$, greater than or equal to about $2.5 \times 10^{-3}$, greater than or equal to about $4 \times 10^{-3}$, greater than or equal to about $8 \times 10^{-3}$, greater than or equal to about $1 \times 10^{-2}$, greater than or equal to about $2.5 \times 10^{-2}$, greater than or equal to about $4 \times 10^{-2}$, greater than or equal to about $8 \times 10^{-2}$, greater than or equal to about $1 \times 10^{-1}$, greater than or equal to about $2.5 \times 10^{-1}$, greater than or equal to about $4 \times 10^{-1}$, greater than or equal to about $8 \times 10^{-1}$, greater than or equal to about 1, greater than or equal to about 2.5, greater than or equal to about 4, greater than or equal to about 8, greater than or equal to about 10, greater than or equal to about 25, greater than or equal to about 40, or greater than or equal to about 80.

The electron mobility (unit: $cm^2 V^{-1} s^{-1}$) of the metal oxide may be less than or equal to about 1000, less than or equal to about 500, less than or equal to about 400, less than or equal to about 300, less than or equal to about 200, less than or equal to about 150, less than or equal to about 140, less than or equal to about 130, less than or equal to about 120, less than or equal to about 100, less than or equal to about 90, less than or equal to about 80, less than or equal to about 70, less than or equal to about 60, less than or equal to about 50, less than or equal to about 30, less than or equal to about 20, less than or equal to about 10, less than or equal to about 9, less than or equal to about 8, less than or equal to about 7, less than or equal to about 6, less than or equal to about 5, less than or equal to about 3, less than or equal to about 2, less than or equal to about 1, less than or equal to about 0.9, less than or equal to about 0.8, less than or equal to about 0.7, less than or equal to about 0.6, less than or equal to about 0.5, less than or equal to about 0.4, less than or equal to about 0.3, less than or equal to about 0.2, or less than or equal to about 0.1.

The small molecule organic compound may be dissolved in a solvent (e.g., polar organic solvent) for a solution process of the metal oxide including Zn, thus the electron auxiliary layer according to an embodiment may be formed by the solution process, and the ratio of the small molecule organic compound and the metal oxide nanoparticles including zinc may be adjusted at a desirable ratio in the electron auxiliary layer.

As is understood by one of ordinary skill in the art, the small molecule organic compound contains carbon. The small molecule organic compound may have a molecular weight of less than or equal to about 2,000 grams per mole (g/mol), for example, less than or equal to about 1,900 g/mol, less than or equal to about 1,800 g/mol, less than or equal to about 1,700 g/mol, less than or equal to about 1,600 g/mol, less than or equal to about 1,500 g/mol, less than or equal to about 1,400 g/mol, less than or equal to about 1,300 g/mol, less than or equal to about 1,200 g/mol, less than or equal to about 1,100 g/mol, or less than or equal to about 1,000 g/mol. The small molecule organic compound may have a molecular weight of greater than or equal to about 100 g/mol, for example, greater than or equal to about 200 g/mol, greater than or equal to about 300 g/mol, greater than or equal to about 400 g/mol, greater than or equal to about 500 g/mol, greater than or equal to about 600 g/mol, greater than or equal to about 700 g/mol, or greater than or equal to about 800 g/mol. The small molecule organic compound may be soluble in a polar solvent (e.g., an alcohol such as ethanol).

The small molecule organic compound may not include a halogen. The small molecule organic compound may not include a metal ion. The small molecule organic compound may not include a diazole moiety (e.g., benzodiazole moiety), a quinoline moiety, a pyridine moiety, a carbazole moiety, or a combination thereof.

Without being bound by any theory, it is believed that the electron transport layer according to an embodiment may be formed by the solution process, so the small molecule organic compounds may efficiently fill pores between metal oxide nanoparticles including Zn to provide an improved uniformity. Without being bound by any theory, it is believed that the small molecule organic compound has an electron mobility lower than the electron mobility of the metal oxide including Zn in the electron transport layer, the high leakage current of the metal oxide including Zn may be reduced and the excess electron injection characteristics of the metal oxide including Zn may be reduced or suppressed; and that ZnO nanoparticles may compensate for characteristics of the small molecule organic material having low electron mobility. When only the small molecule organic compound is employed, it may be difficult to realize the desirable electron-luminescent properties in the quantum dot-based electroluminescent device. The small molecule organic compound may provide an electron transport layer along with the metal oxide nanoparticles including zinc by the solution process, and the electron transport characteristics may be controlled and the energy level may be adjusted. As a result, the efficiency and the life-span characteristics of the light emitting device may be improved.

The small molecule organic compound may have an absolute value of an LUMO energy level of greater than or equal to about 2.5 eV, for example, greater than or equal to about 2.6 eV, greater than or equal to about 2.7 eV, greater than or equal to about 2.8 eV, greater than or equal to about 2.82 eV, or greater than or equal to about 2.85 eV and less than or equal to about 3 eV, for example, less than or equal to about 2.95 eV, or less than or equal to about 2.9 eV.

The small molecule organic compound may have an absolute value of a HOMO energy level of greater than or equal to about 6.5 eV, for example, greater than or equal to about 7 eV, greater than or equal to about 7.1 eV, greater than or equal to about 7.2 eV, or greater than or equal to about 7.3 eV and less than or equal to about 8 eV, for example, 7.9 eV, less than or equal to about 7.8 eV, less than or equal to about 7.7 eV, less than or equal to about 7.6 eV, less than or equal to about 7.5 eV, or less than or equal to about 7.4 eV.

Electron mobility in a thin film including, e.g., consisting of, the small molecule organic compound may be lower than electron mobility in a thin film including, e.g., consisting of, the nanoparticles. A thickness of the thin film may be greater than or equal to about 20 nm and less than or equal to about 200 nm. The electron mobility may be measured by an appropriate method which is not particularly limited.

The small molecule organic compound may include a compound including a triaryl phosphine oxide moiety (e.g., triphenyl phosphine oxide) linked with an aromatic ring.

The small molecule organic compound may include a compound represented by Chemical Formula 2:

Chemical Formula 2

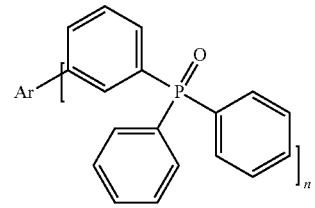

wherein, Ar is a substituted or unsubstituted C6 to C40 aryl group (e.g., a substituted or unsubstituted phenyl moiety), a substituted or unsubstituted C3 to C40 heteroaryl group or a substituted or unsubstituted C3 to C40 heterocycloalkyl group (e.g., a substituted or unsubstituted triazine moiety or a substituted or unsubstituted triazine trione moiety), or a combination thereof, n is greater than or equal to 1, for example, greater than or equal to 2, or greater than or equal to 3 and less than or equal to 10, and for example less than or equal to 9, less than or equal to 8, less than or equal to 7, less than or equal to 6, less than or equal to 5, or less than or equal to 4.

The small molecule organic compound may include a compound represented by Chemical Formula 2-1:

Chemical Formula 2-1

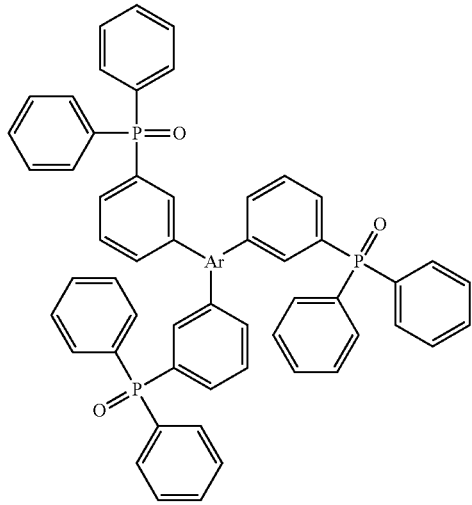

wherein, Ar is a substituted or unsubstituted C6 to C40 aryl group (substituted or unsubstituted phenyl moiety, or a substituted or unsubstituted naphthyl moiety), a substituted or unsubstituted C3 to C40 heteroaryl group, or a substituted or unsubstituted C3 to C40 heterocycloalkyl group (e.g., a substituted or unsubstituted triazine moiety, or a substituted or unsubstituted triazine trione moiety), or a combination thereof.

In the electron auxiliary layer, a content of carbon relative to 1 mole of zinc may be greater than or equal to about 0.01 moles, for example, greater than or equal to about 0.02 moles, greater than or equal to about 0.03 moles, greater than or equal to about 0.04 moles, greater than or equal to about 0.05 moles, greater than or equal to about 0.1 moles, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, or greater than or equal to about 0.8 moles. In the electron auxiliary layer, the content of carbon relative to 1 mole of zinc may be less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 11 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles, or less than or equal to about 1 mole. The electron auxiliary layer according to an embodiment may be formed using the solution process, as described above, and thus, a mixing ratio of the nanoparticles of metal oxides including Zn and the small molecule organic compound may be easily controlled. The mixing ratio may be determined considering a composition of a metal oxide, types of the small molecule organic compound, types of the hole auxiliary layer, properties of a desirable electron auxiliary layer, and the like. Like this, by controlling the mixing ratio, an amount of the electron injected into the quantum dot emission layer may be controlled and thus optimization of charge balance in the device may be realized.

A thickness of the electron auxiliary layer may be appropriately selected considering photoluminescence wavelengths of quantum dots, thicknesses of emission layers, types, and thicknesses of hole auxiliary layers, and the like. In the device according to an embodiment, the quantum dots in the emission layer may emit light having a center wavelength of about 600 nm to about 640 nm, the thickness of the electron auxiliary layer may be greater than or equal to about 20 nm, for example, greater than or equal to about 25 nm, greater than or equal to about 30 nm, greater than or equal to about 35 nm, greater than or equal to about 40 nm, or greater than or equal to about 45 nm and less than or equal to about 80 nm, for example, less than or equal to about 75 nm, less than or equal to about 70 nm, less than or equal to about 65 nm, less than or equal to about 60 nm, or less than or equal to about 55 nm. In the device according to an embodiment, the quantum dots may emit light having a center wavelength of less than or equal to about 500 nm, the thickness of the electron auxiliary layer may be greater than or equal to about 60 nm, for example, greater than or equal to about 65 nm, greater than or equal to about 70 nm, or greater than or equal to about 75 nm and less than or equal to about 120 nm, for example, less than or equal to about 115 nm, less than or equal to about 110 nm, less than or equal to about 105 nm, less than or equal to about 100 nm, less than or equal to about 95 nm, or less than or equal to about 90 nm.

An embodiment provides a method of manufacturing the aforementioned light emitting device. The method includes dispersing the nanoparticles and the small molecule organic compound in a polar organic solvent to prepare dispersion; applying the prepared dispersion on an emission layer including quantum dots to form an electron auxiliary layer; and removing the organic solvent from the electron auxiliary layer.

Details of the nanoparticles and the small molecule organic compound are the same as described above. A specific method of forming the electrode and the hole auxiliary layer on the aforementioned substrate may be appropriately selected but is not particularly limited. The aforementioned hole auxiliary layer 12 and the aforementioned emission layer 13 may be for example formed with a solution process, for example a spin coating, a slit coating, inkjet printing, a nozzle printing, spraying, a doctor blade coating, or a combination thereof, but is not limited thereto. An applying manner of the electron auxiliary layer is not particularly limited but may be appropriately selected.

The polar solvent may include a C1 to C10 alcohol solvent such as ethanol, a C2 to C20 sulfoxide solvent such as dimethyl sulfoxide, a C2 to C20 amide solvent such as dimethyl formamide, or a combination thereof.

In the dispersion, a content of the small molecule organic compound based on 100 parts by weight of the nanoparticles may be greater than or equal to 1 part by weight, for example, greater than or equal to 5 parts by weight, greater than or equal to 10 parts by weight, greater than or equal to 15 parts by weight, or greater than or equal to 20 parts by weight.

In the dispersion, the content of the small molecule organic compound based on 100 parts by weight of the nanoparticles may be less than or equal to about 50 parts by weight, for example, less than or equal to about 40 parts by weight, less than or equal to about 35 parts by weight, less than or equal to about 30 parts by weight, less than or equal to about 25 parts by weight, or less than or equal to about 20 parts by weight.

The removing of the organic solvent from the electron auxiliary layer may be for example performed (for example under vacuum) at a predetermined temperature (e.g., a temperature of greater than or equal to about 60° C., or greater than or equal to about 70° C. and less than or equal to about 100° C., for example, less than or equal to about 90° C., less than or equal to about 80° C., or less than or equal to about 75° C.), but is not limited thereto.

An embodiment provides an electronic device including the aforementioned light emitting device. The electronic device may be applied to various electronic devices such as display devices or lighting devices.

Hereinafter, the embodiments are illustrated in more detail with reference to examples. However, these examples are exemplary, and the present scope is not limited thereto.

Analysis Method

1. Photoluminescence Analysis

Photoluminescence (PL) spectra of the prepared nanocrystal are obtained using a Hitachi F-7000 spectrometer at an irradiation wavelength of 372 nanometers (nm).

2. Ultraviolet-Visible (UV-Vis) Spectroscopic Analysis

Hitachi U-3310 spectrometer is used to perform a UV spectroscopic analysis and obtain UV-Visible absorption spectra.

3. TEM Analysis

Transmission electron microscope photographs of nanocrystals are obtained using an UT F30 Tecnai electron microscope.

4. X-Ray Diffraction (XRD) Analysis

An XRD analysis is performed using a Philips XPert PRO equipment with a power of 3 kilowatts (kW).

5. Electroluminescence Spectroscopic Analysis

A current depending on a voltage is measured using a Keithley 2635B source meter while applying a voltage and electroluminescent (EL) light emitting luminance is measured using a CS2000 spectrometer.

Synthesis of Quantum Dots

Reference Example 1: Preparation of Red Light Emitting Quantum Dots (1) 0.2 millimoles (mmol) of indium acetate is dissolved along with palmitic acid in 300 milliliters (mL) of reaction flask including 1-octadecene and heated at 120° C. under vacuum. After 1 hour, atmosphere in the reactor is converted to nitrogen. After heating at 280° C., a mixed solution of tris(trimethylsilyl)phosphine (TMS3P) and trioctylphosphine are rapidly injected and reacted for 30 minutes. Acetone is added to the reaction solution which has been rapidly cooled to room temperature and centrifuged to provide a precipitate, and the obtained precipitate is dispersed in toluene.

Se powder and S powder are dissolved in trioctylphosphine (TOP) to prepare an Se/TOP stock solution and a S/TOP stock solution.

Zinc acetate and oleic acid are dissolved in trioctylamine in 300 mL of reaction flask and vacuum-treated at 120° C. for 10 minutes. It is substituted with Nitrogen ($N_2$) in the flask and then heated at 180° C.

The obtained InP core is added and reacted at reaction temperature of 280° C. for 60 minutes while adding a predetermined amount of the Se/TOP stock solution and a predetermined amount of the S/TOP stock solution.

An excess amount of ethanol is added into the reactants including the semiconductor nanocrystals and then centrifuged. After the centrifuge, a supernatant is discarded, the precipitate is dried and then dispersed in chloroform or toluene to provide a quantum dot solution (hereinafter, QD solution). The obtained QD solution is measured for a UV-Vis absorption spectrum. The obtained quantum dots emit red light.

Reference Example 2: Preparation of Blue Light Emitting Quantum Dot (1) Selenium (Se) and tellurium (Te) are dispersed in trioctylphosphine (TOP) to obtain a 2 molar (M) Se/TOP stock solution and 0.1 M Te/TOP stock solution.

0.125 mmol of zinc acetate is added along with oleic acid to a reactor including trioctylamine and the solution is heated under vacuum at 120° C. After one hour, an atmosphere in the reactor is converted into nitrogen.

Subsequently, the reactor is heated up to 300° C., the prepared Se/TOP stock solution and Te/TOP stock solution are rapidly injected thereinto in a Te/Se ratio of 1/25. When the reaction is complete, acetone is added to the reaction solution that is rapidly cooled into room temperature, and a precipitate obtained by centrifugation is dispersed in toluene to obtain ZnTeSe quantum dots.

(2) 1.8 mmol (0.336 grams (g)) of zinc acetate is added along with oleic acid to a flask including trioctylamine and vacuum-treated at 120° C. for 10 minutes. The flask is substituted with nitrogen ($N_2$) and a temperature is increased up to 180° C. The obtained ZnTeSe core is added thereto and a reaction is performed while adding Se/TOP and S/TOP at a reaction temperature of about 280° C. After the reaction is complete, the reactor is cooled, the prepared nanocrystal is centrifuged with ethanol and is dispersed in toluene to obtain ZnTeSe/ZnSeS core/shell quantum dots.

Synthesis of Metal Oxide Nanoparticles

Reference Example 3: Synthesis of ZnO

Zinc acetate dihydrate is added into a reactor including dimethyl sulfoxide and heated at 60° C. under air. Subsequently, 15 mmol of tetramethyl ammonium hydroxide pentahydrate is dissolved into 30 mL of ethanol and added in a dropwise of 3 mL into the reactor. After stirring the same for 1 hour, the obtained ZnO nanoparticles and ethyl acetate are centrifuged at a ratio of 1:9 (volume ratio) and dispersed in ethanol to obtain ZnO nanoparticles.

The obtained nanoparticles are performed with an X-ray diffraction analysis to confirm that ZnO crystals are formed. A transmission electron microscopic analysis is performed for the obtained nanoparticles, and the results show that the particles have an average size of about 3 nm.

Energy bandgap of the obtained nanoparticles is measured and monitored by a UV band edge tangent line (UV-2600, SHIMADZU). The results show that the synthesized ZnO has an energy bandgap of about 3.52 eV.

Manufacture of Light Emitting Device

Example 1

Indium tin oxide (ITO)-deposited glass substrate is treated for the surface with UV-ozone for 15 minutes and then spin-coated with a poly(3,4-ethylenedioxythiophene) polystyrene sulfonate (PEDOT:PSS) solution (H.C. Starks) and heated at 150° C. for 10 minutes under air atmosphere, and then it is heat-treated again at 150° C. for 10 minutes under $N_2$ atmosphere to provide a hole injection layer having a thickness of 30 nm. Subsequently, poly[(9,9-dioctylfluorenyl-2,7-diyl-co(4,4'-(N-4-butylphenyl)diphenylamine] solution (TFB) (Sumitomo) is spin-coated on the hole injection layer and heated at 150° C. for 30 minutes to provide a hole transport layer having a thickness of 25 nm.

The core/shell quantum dots obtained from Reference Example 1 are spin-coated on the obtained hole transport layer and heated at 80° C. for 30 minutes to provide an emission layer having a thickness of 25 nm.

A solution (solvent: ethanol, optical density: 0.5 arbitrary units (a.u.)) of ZnO nanoparticles obtained from Reference Example 3 is prepared. An small molecule organic compound solution (concentration: 2 weight percent (wt %)) is prepared by dissolving a small molecule organic compound (2,4,6-tris[3-(diphenylphosphinyl)phenyl]-1,3,5-triazine (PO-T2T)) having the following chemical formula in ethanol:

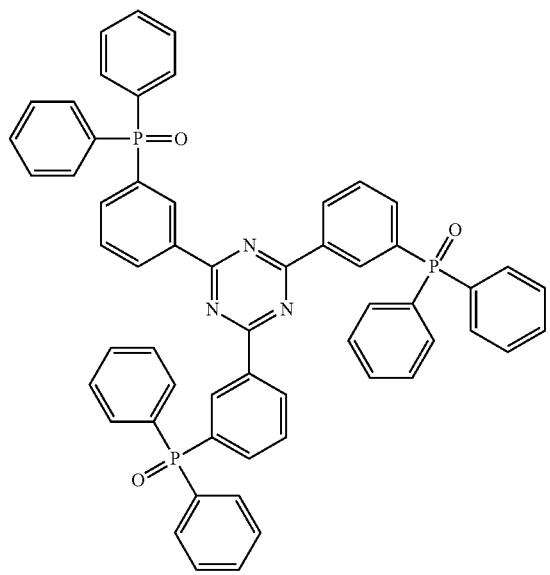 [SMILES: O=P(c1ccccc1)(c1ccccc1)c1cccc(-c2nc(-c3cccc(P(=O)(c4ccccc4)c4ccccc4)c3)nc(-c3cccc(P(=O)(c4ccccc4)c4ccccc4)c3)n2)c1]

A solution for an electron transport layer is obtained by mixing the prepared solutions (in a weight ratio=5:1 of nanoparticle: small molecule organic compound). The obtained solution is spin-coated on the emission layer and heated at 80° C. for 30 minutes to provide an electron auxiliary layer having a thickness of 50 nm. 90 nm of aluminum (Al) is vacuum-deposited on the obtained electron auxiliary layer to provide a second electrode, so as to obtain a light emitting device.

The obtained quantum dot light emitting device is evaluated for electro-luminescent properties using a Keithley 2200 source meter and Minolta CS2000 spectroradiometer (current-voltage-luminance measurement equipment). Specifically, a current depending upon a voltage applied to the device, luminance, and electro-luminescence (EL) are measured by the current-voltage-luminance measurement equipment, and thereby external quantum efficiency is calculated.

Figure 2:
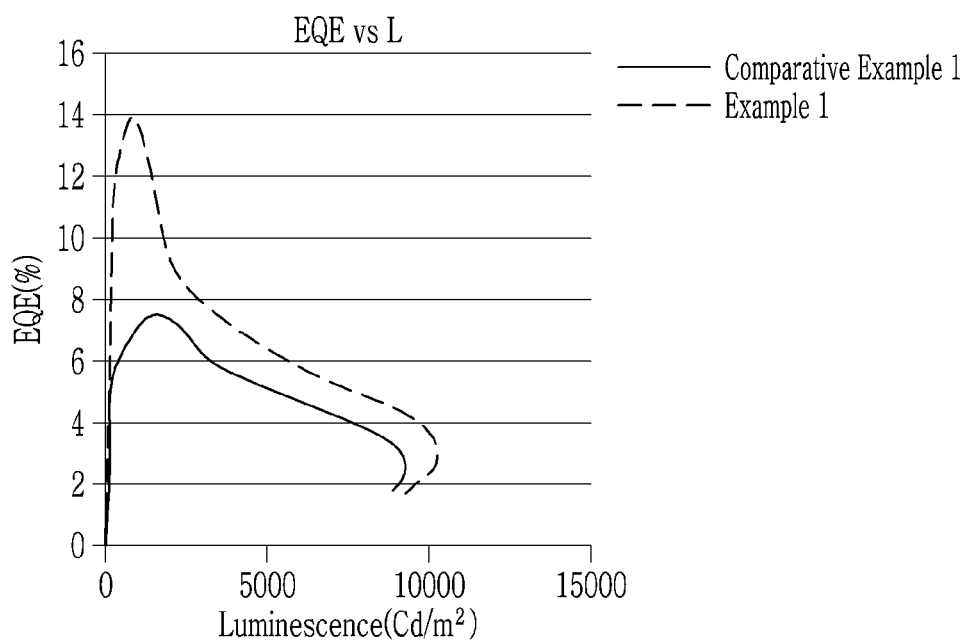
FIG. 2 is a graph of external quantum efficiency (EQE) (percent (%)) versus luminescence (L) (candelas per square meter ($Cd/m^2$)) showing electro-luminescent properties of the devices according to Example 1 and Comparative Example 1-1.
Figure 3:
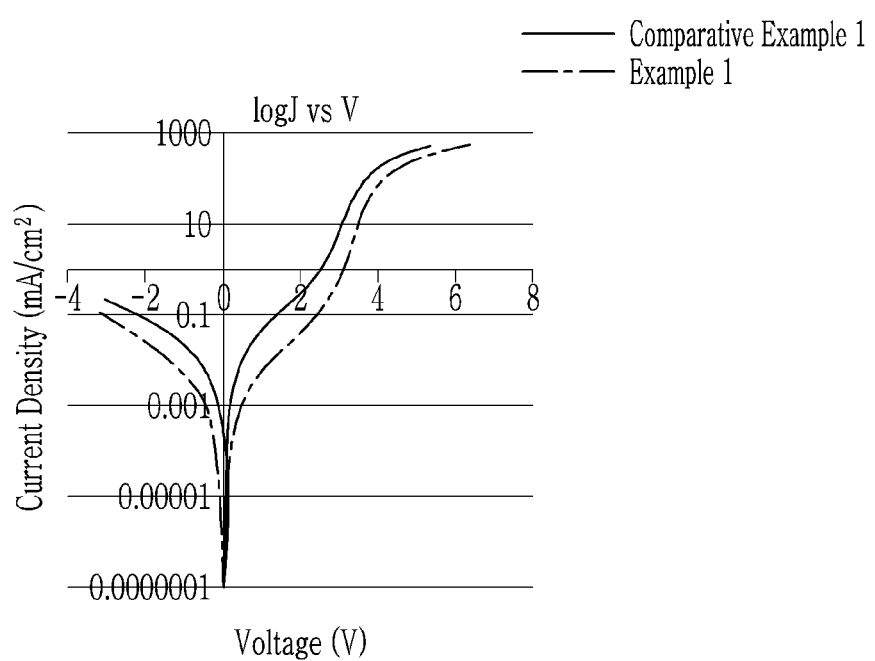
FIG. 3 is a graph of current density (J) (milliamperes per square centimeter ($mA/cm^2$)) versus voltage (volts (V)) showing a current density-voltage curve (leakage current) of the devices according to Example 1 and Comparative Example 1-1.

The results are shown in Table 1, FIGS. 2 and 3.

In this example, the electron mobility of the zinc oxide particle and the electron mobility of the aforementioned small molecule organic compound are measured by using a FEM method and a TOF method, respectively. The results confirm that the electron mobility of the aforementioned small molecule organic compound is lower than that of the zinc oxide particle.

Comparative Example 1-1

A light emitting device is obtained in accordance with the same procedure as in Example 1, except that the small molecule organic compound (PO-T2T) is not used.

The obtained light emitting device is evaluated for an electro-luminescence according to the same procedure as in Example 1.

The results are shown in Table 1, FIGS. 2 and 3.

Comparative Example 1-2

A light emitting device is obtained in accordance with the same procedure as in Example 1, except that ZnO is not used. The obtained light emitting device is evaluated for electro-luminescence properties according to the same procedure as in Example 1.

TABLE 1

| | Description | Max. EQE | EQE @ 100 nit | Max. Cd/A | Lambda (λ) max. | FWHM | CIE x | CIE y | Max. Lum. |
|---|---|---|---|---|---|---|---|---|---|
| Comp. Ex. 1-1 | ZnO only | 7.4 | 3.5 | 7.5 | 633 | 34 | 0.6950 | 0.3040 | 9200 |
| Ex. 1 | ZnO + PO-T2T | 13.8 | 8.8 | 14.4 | 632 | 34 | 0.6935 | 0.3050 | 10180 |

Max. EQE: maximum (max.) external quantum efficiency

EQE@ 100 nit: external quantum efficiency at luminance of 100 nit (candelas per square meter)

max Cd/A (candelas per ampere): maximum current efficiency

λmax.: maximum photoluminescence wavelength

Max. Lum.: maximum luminance

From the results of Table 1 and FIG. 2, it is confirmed that the device according to Example 1 may exhibit improved efficiency and improved luminance compared to the device according to Comparative Example 1-1. From the results of FIG. 3, it is confirmed that the device according to Example 1 exhibits greatly reduced leakage current compared to the device according to Comparative Example 1-1.

Example 2

A light emitting device is obtained in accordance with the same procedure as in Example 1, except the blue light emitting quantum dots synthesized from Reference Example 2 are used instead of the red light emitting quantum dots, and a small molecule organic compound (1,3,5-tri[3-(diphenylphosphoryl)phenyl]benzene (TP3PO)) having the following structure is used instead of PO-T2T, and a layer thickness is employed as follows:

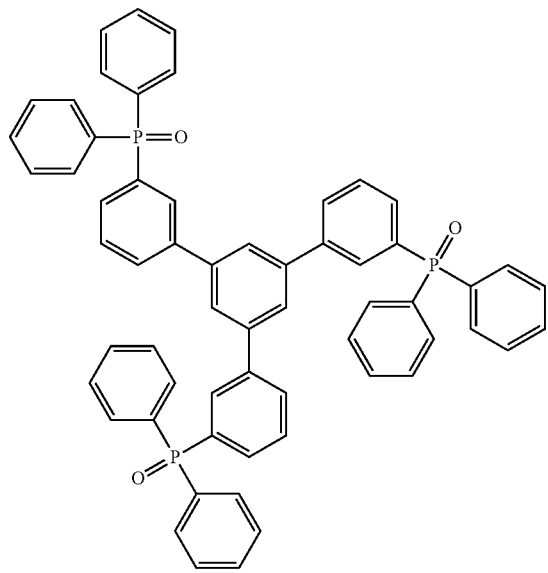 [SMILES: O=P(c1ccccc1)(c1ccccc1)c1cccc(-c2cc(-c3cccc(P(=O)(c4ccccc4)c4ccccc4)c3)cc(-c3cccc(P(=O)(c4ccccc4)c4ccccc4)c3)c2)c1]

The obtained light emitting device is evaluated for an electro-luminescence in accordance with the same procedure as in Example 1.

Figure 4:
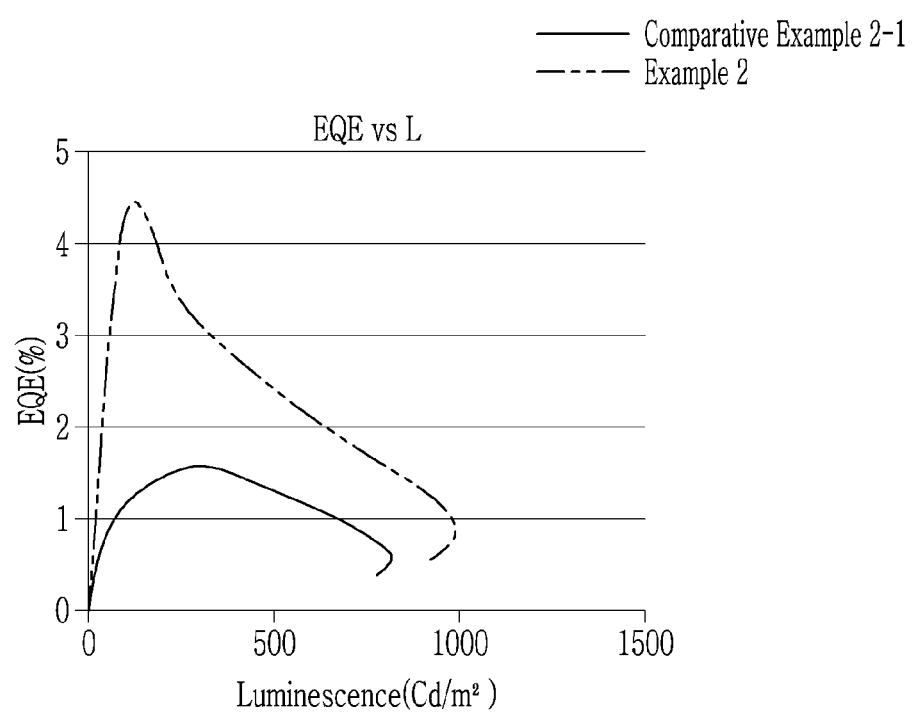
FIG. 4 is a graph of external quantum efficiency (%) versus luminescence ($Cd/m^2$) showing electro-luminescent properties of the devices according to Example 2 and Comparative Example 2-1.
Figure 5:
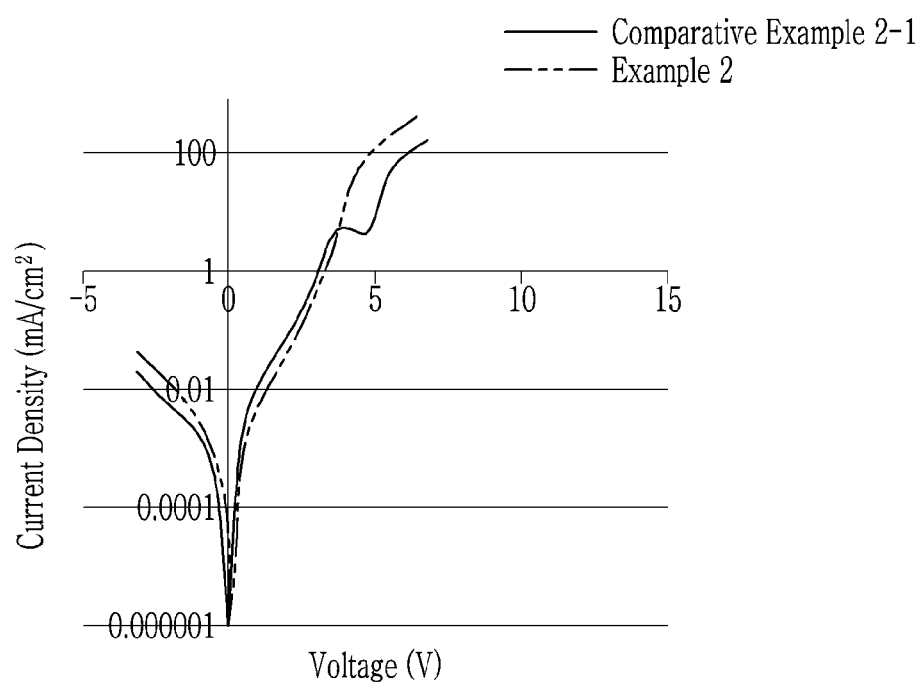
FIG. 5 is a graph of current density ($mA/cm^2$) versus voltage (V) showing a current density-voltage curve (leakage current) of the devices according to Example 2 and Comparative Example 2-1.

The results are shown in Table 2, FIGS. 4 and 5.

In this example, the electron mobility of the zinc oxide particle and the electron mobility of the aforementioned small molecule organic compound are measured by using a FEMT method and a TOF method, respectively. The results confirm that the electron mobility of the aforementioned small molecule organic compound is lower than that of the zinc oxide particle.

Comparative Example 2-1

A light emitting device is obtained in accordance with the same procedure as in Example 2, except that the small molecule organic compound (TP3PO) is not used.

The obtained light emitting device is evaluated for electro-luminescence properties and life-span characteristics according to the same method as in Example 1.

The results are shown in Table 2, FIGS. 4 and 5.

Comparative Example 2-2

Figure 6:
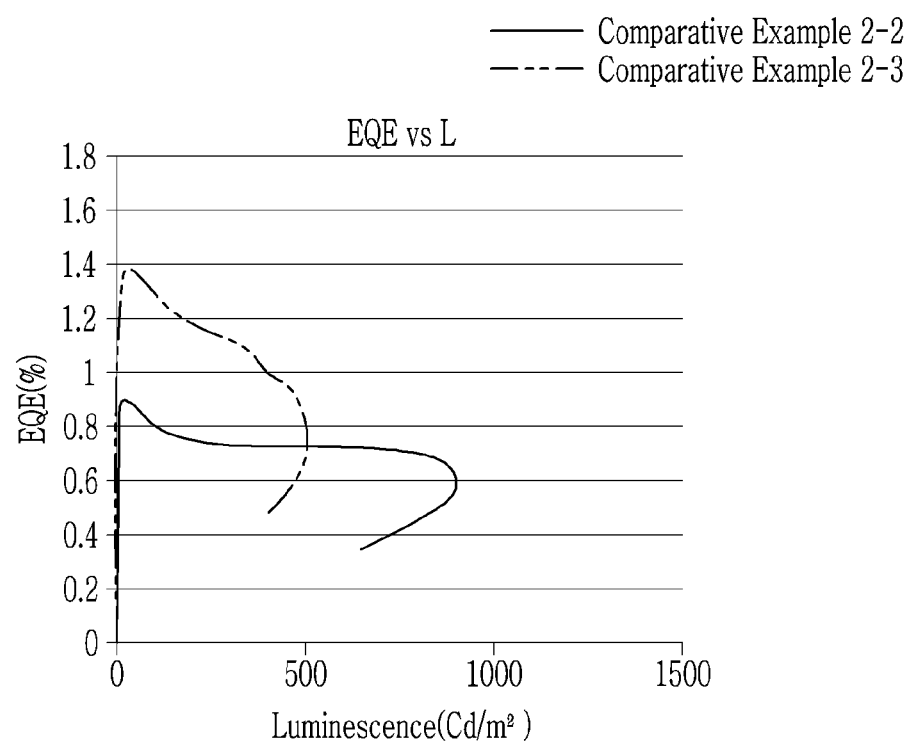
FIG. 6 is a graph of external quantum efficiency (%) versus luminescence ($Cd/m^2$) showing electro-luminescent properties of the devices according to Comparative Example 2-2 and Comparative Example 2-3.

A light emitting device is obtained in accordance with the same procedure as in Example 2, except that ZnO is not used and an organic compound PO-T2T is used. The obtained light emitting device is evaluated for electro-luminescence properties according to the same method as in Example 1. The results are shown in Table 2 and FIG. 6.

Comparative Example 2-3

A light emitting device is obtained in accordance with the same procedure as in Example 2, except that ZnO is not used. The obtained light emitting device is evaluated for electro-luminescence properties according to the same method as in Example 1. The results are shown in Table 2 and FIG. 6.

TABLE 2

| | Description | Max. EQE | EQE @ 100 nit | Max. Cd/A | Lambda max. | FWHM | CIE x | CIE y | Max. Lum |
|---|---|---|---|---|---|---|---|---|---|
| Comp. Ex. 2 | ZnO | 1.6 | 1.1 | 0.9 | 455 | 27 | 0.1439 | 0.0624 | 810 |
| Ex. 2 | ZnO:TP3PO | 4.3 | 4.3 | 2.8 | 455 | 26 | 0.1430 | 0.0640 | 990 |
| Comp. Ex. 2-2 | PO-T2T only | 0.9 | 0.8 | 0.9 | 456 | 28 | 0.1628 | 0.0988 | 900 |
| Comp. Ex. 2-3 | TP3PO only | 1.4 | 1.3 | 1.0 | 457 | 27 | 0.1440 | 0.0696 | 510 |

From the results of Table 2 and FIG. 4, it is confirmed that the device according to Example 2 exhibits improved efficiency and improved luminance compared to the devices according to Comparative Examples 2-1, 2-2, and 2-3. From the results of FIG. 5, it is confirmed that the device according to Example 2 exhibits a greatly reduced leakage current compared to the device according to Comparative Example 2-1.

Experimental Example 1

When a constant current driven at 100 nit is applied to the devices according to Example 1 and Comparative Example 1-1, a time (hr) (T95(h)) taken until the luminance is reached to 95% relative to 100% of the initial luminance and a time (hr) (T50(h)) taken until the luminance is reach to 50% relative to 100% of the initial luminance are evaluated. As shown in the results, it is confirmed that the device according to Example 1 exhibits T95 (h) which is improved by two times relative to the device according to Comparative Example 1-1 and T50(h) which is improved by 1.5 times.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

10: light emitting device
11: first electrode
12: hole auxiliary layer
13: emission layer
14: electron auxiliary layer
15: second electrode

What is claimed is:

1. A light emitting device, comprising
a first electrode and a second electrode facing each other,
an emission layer disposed between the first electrode and the second electrode, the emission layer comprising quantum dots, and
an electron auxiliary layer disposed between the emission layer and the second electrode, the electron auxiliary layer comprising nanoparticles and a small molecule organic compound,
wherein the nanoparticles comprise a metal oxide comprising zinc, and
an electron mobility of the small molecule organic compound is less than an electron mobility of the nanoparticles.

2. The light emitting device of claim 1, wherein a work function of the first electrode is greater than a work function of the second electrode.

3. The light emitting device of claim 1, wherein the first electrode comprises indium tin oxide.

4. The light emitting device of claim 1, wherein the second electrode comprises a conductive metal.

5. The light emitting device of claim 1, wherein the quantum dots do not comprise cadmium.

6. The light emitting device of claim 1, wherein the quantum dots comprise indium and phosphorous.

7. The light emitting device of claim 1, wherein the quantum dots comprise a chalcogen element and zinc.

8. The light emitting device of claim 1, wherein an absolute value of a lowest unoccupied molecular orbital energy level of the quantum dots is less than an absolute value of a lowest unoccupied molecular orbital energy level of the metal oxide.

9. The light emitting device of claim 1, wherein the metal oxide is represented by Chemical Formula 1:

$$Zn_{1-x}M_xO \quad \text{Chemical Formula 1}$$

wherein, in Chemical Formula 1,
M is Mg, Ca, Zr, W, Li, Ti, Y, Al, or a combination thereof, and
$0 \leq x \leq 0.5$.

10. The light emitting device of claim 1, wherein the metal oxide comprises zinc oxide, zinc magnesium oxide, or a combination thereof.

11. The light emitting device of claim 1, wherein an average size of the nanoparticles is greater than or equal to about 1 nanometer and less than or equal to about 10 nanometers.

12. The light emitting device of claim 1, wherein an average size of the nanoparticles is greater than or equal to about 1.5 nanometers and less than or equal to about 5 nanometers.

13. The light emitting device of claim 1, wherein the small molecule organic compound has
an absolute value of a lowest unoccupied molecular orbital energy level of greater than or equal to about 2.5 electronvolts and less than or equal to about 3 electronvolts, and
an absolute value of a highest occupied molecular orbital energy level of greater than or equal to about 7 electronvolts and less than or equal to about 7.5 electronvolts.

14. The light emitting device of claim 1, wherein electron mobility in a thin film comprising the small molecule organic compound is lower than electron mobility in a thin film comprising the nanoparticles.

15. The light emitting device of claim 1, wherein the small molecule organic compound comprises a compound comprising a triaryl phosphine oxide moiety linked with an aromatic ring.

16. The light emitting device of claim 1, wherein the small molecule organic compound comprises a compound represented by Chemical Formula 2:

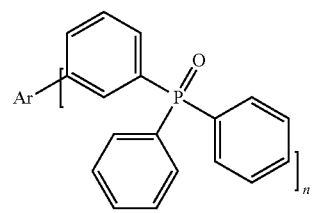

Chemical Formula 2 wherein, Ar is a substituted or unsubstituted C6 to C40 aryl group, a substituted or unsubstituted C3 to C40 heteroaryl group, a substituted or unsubstituted C3 to C40 heterocycloalkyl group, or a combination thereof, and
n is an integer of 1 to 10.

17. The light emitting device of claim 1, wherein the small molecule organic compound comprises a compound represented by Chemical Formula 2-1:

Chemical Formula 2-1

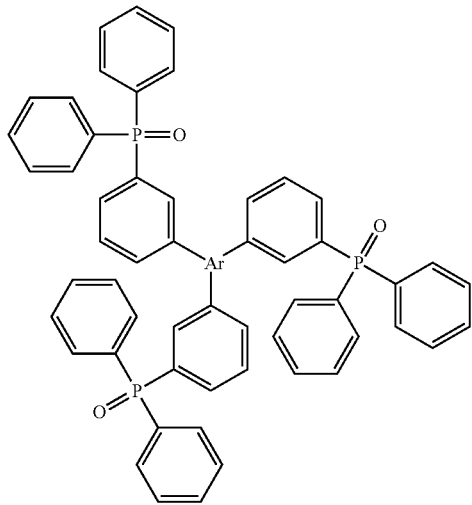

wherein, Ar is a substituted or unsubstituted C6 to C40 aryl group, a substituted or unsubstituted C3 to C40 heteroaryl group, a substituted or unsubstituted C3 to C40 heterocycloalkyl group, or a combination thereof.

18. The light emitting device of claim 1, wherein in the electron auxiliary layer, a content of carbon relative to 1 mole of zinc is greater than or equal to about 0.01 moles.

19. The light emitting device of claim 1, wherein in the electron auxiliary layer, a content of carbon relative to 1 mole of zinc is less than or equal to about 20 moles.

20. The light emitting device of claim 1, wherein the quantum dots emit light having a center wavelength of about 600 nanometers to about 640 nanometers and a thickness of the electron auxiliary layer is greater than or equal to about 20 nanometers and less than or equal to about 50 nanometers.

21. The light emitting device of claim 1, wherein the quantum dots emit light having a center wavelength of less than or equal to about 500 nanometers and the thickness of the electron auxiliary layer is greater than or equal to about 60 nanometers and less than or equal to about 100 nanometers.

22. A method of manufacturing the light emitting device of claim 1, comprising
dispersing the nanoparticles and the small molecule organic compound in a polar organic solvent to prepare a dispersion;
applying the dispersion on the emission layer comprising the quantum dots to form the electron auxiliary layer; and
removing the polar organic solvent from the electron auxiliary layer.

23. The method of claim 22, wherein the organic solvent comprises an alcohol solvent, a sulfoxide solvent, an amide solvent, or a combination thereof.

24. The method of claim 22, wherein in the dispersion, a content of the small molecule organic compound based on 100 parts by weight of the nanoparticles is greater than or equal to about 1 part by weight and less than or equal to about 50 parts by weight.

25. A display device comprising the light emitting device of claim 1.

* * * * *